United States Patent
Nenoff et al.

(10) Patent No.: US 9,741,945 B1
(45) Date of Patent: Aug. 22, 2017

(54) TUNABLE PHOTOLUMINESCENT METAL-ORGANIC-FRAMEWORKS AND METHOD OF MAKING THE SAME

(71) Applicant: National Technology & Engineering Solutions of Sandia, LLC, Albuquerque, NM (US)

(72) Inventors: Tina M. Nenoff, Albuquerque, NM (US); Dorina Florentina Sava Gallis, Albuquerque, NM (US); Lauren E.S. Rohwer, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 476 days.

(21) Appl. No.: 14/319,675

(22) Filed: Jun. 30, 2014

Related U.S. Application Data (60) Provisional application No. 61/842,645, filed on Jul. 3, 2013.

(51) Int. Cl.
*A61K 9/00* (2006.01)
*H01L 51/00* (2006.01)

(52) U.S. Cl.
CPC ...... *H01L 51/0079* (2013.01); *H01L 51/0089* (2013.01)

(58) Field of Classification Search
CPC .................................................. H01L 51/0079
See application file for complete search history.

(56) References Cited

U.S. PATENT DOCUMENTS

2009/0062409 A1\* 3/2009 Matzger ................. C07F 3/003
521/50

FOREIGN PATENT DOCUMENTS

ES    WO 2013050402 A1 \*  4/2013 ............. B01J 31/16
WO   WO 2011127301 A2 \* 10/2011 ............. B01J 20/22

OTHER PUBLICATIONS

Dorina F. Sava et al., "Intrinsic Broad-Band White-Light Emission by a Tuned, Corrugated Metal-Organic Framework", J. Am. Chem. Soc. 2012, 134, pp. 3983-3986.
Dorina F. Sava Gallis et al., "Efficient Photoluminescence via Metal-Ligand Alteration in a New MOFs Family", Chem. Mater. 2014, 26, pp. 2943-2951.

\* cited by examiner

*Primary Examiner* — Paul Dickinson
(74) *Attorney, Agent, or Firm* — Daniel J. Jenkins (57) ABSTRACT

The present disclosure is directed to new photoluminescent metal-organic frameworks (MOFs). The newly developed MOFs include either non rare earth element (REE) transition metal atoms or limited concentrations of REE atoms, including: Ti, V, Cr, Mn, Fe, Co, Ni, Cu, Zn, Ga, Ge, Y, Ru, Ag, Cd, Sn, Sb, Ir, Pb, Bi, that are located in the MOF framework in site isolated locations, and have emission colors ranging from white to red, depending on the metal concentration levels and/or choice of ligand.

5 Claims, 6 Drawing Sheets

TUNABLE PHOTOLUMINESCENT METAL-ORGANIC-FRAMEWORKS AND METHOD OF MAKING THE SAME

CROSS-REFERENCE TO RELATED APPLICATIONS

This application claims priority to U.S. Provisional Patent Application No. 61/842,645, filed on Jul. 3, 2013, entitled "TUNABLE PHOTOLUMINESCENT MOFS AND ZEOLITES AND METHOD OF MAKING THE SAME", the entirety of which is incorporated herein by reference.

STATEMENT OF GOVERNMENT INTEREST

The United States Government has rights in this invention pursuant to Contract No. DE-AC04-94AL85000 between the United States Department of Energy and Sandia Corporation, for the operation of the Sandia National Laboratories.

FIELD

The present disclosure is generally directed to photoluminescence, and is more particularly directed to tunable, photoluminescent metal-organic frameworks (MOFs).

BACKGROUND

Solid-state lighting (SSL) is anticipated to be the next generation of efficient lighting to replace traditional incandescent or fluorescent lamps. SSL devices are primarily based on inorganic light emitting diodes (LEDs), with ongoing development in organic LEDs (OLEDs). A challenge is to improve the color quality of such devices. Currently, commercial LEDs produce white light by exciting yellow-emitting YAG:Ce phosphors with blue InGaN LEDs, resulting in bluish white light having a poor color rendering index (CRI) that is not suitable for general illumination. Higher quality devices add a red-emitting inorganic phosphor, such as $Eu^{2+}$-doped nitridosilicates, to produce light that can realistically render orange and red objects; yet, they have a broad emission that extends to the near IR, producing unseen illumination. Increasing the lumens of red light per watt of light emitted (high luminous efficacy of radiation) requires strong emission at ~615 nm, which can be achieved with $Eu^{3+}$-doped phosphors. $Eu^{3+}$-doped inorganic phosphors have quantum yields (QYs) as high as 88%, extremely low thermal quenching, and tremendous thermal and chemical stability. Unfortunately, they have drawbacks including high annealing temperatures (900° C. or higher) and low blue absorbance (which limits their use in SSL devices that are based on blue InGaN LED excitation).

The need remains, therefore, for a light emitting material that is energy-efficient to produce; and satisfies the criteria for applications such as solid-state lighting. The need also remains for a light emitting material that uses no or very limited rare earth elements in its composition.

SUMMARY OF THE DISCLOSURE

The present invention is directed to new photoluminescent metal-organic frameworks (MOFs). The newly developed MOFs include either non rare earth element (REE) transition metal atoms or limited concentrations of REE atoms, including: Ti, V, Cr, Mn, Fe, Co, Ni, Cu, Zn, Ga, Ge, Y, Ru, Ag, Cd, Sn, Sb, Ir, Pb, Bi, that are located in the MOF framework in site isolated locations, and have emission colors ranging from white to red, depending on the metal concentration levels and/or choice of ligand.

According to an embodiment, a group of novel metal-organic-framework materials are disclosed. The group includes $X(BTB)_{7/3}$ $(H_2O)_2.(DEF)_6$, $X(BTB)(H_2O).(H_2O)$ (DEF), $X(TTB)_{2/3}$ $(OA).(DMF)_{2.5}$, $X(TTB)(DEF)(H_2O).(DEF)_5$, and $X(TCBB)(DMA)_{4.5}(MeOH)$, where X is one or more non rare earth element (REE) transition metal atoms or REE atoms. In an embodiment, X is one or more elements selected from a group consisting of In, Eu, Ti, V, Cr, Mn, Fe, Co, Ni, Cu, Zn, Ga, Ge, Y, Ru, Ag, Cd, Sn, Sb, Ir, Pb, Bi, that are located in the MOF framework in site isolated locations.

According to an embodiment, a solid state lighting (SSL) device that is disclosed that includes a metal-organic-framework material selected from a group including $X(BTB)_{7/3}$ $(H_2O)_2.(DEF)_6$, $X(BTB)(H_2O).(H_2O)(DEF)$, $X(TTB)_{2/3}$ $(OA).(DMF)_{2.5}$, $X(TTB)(DEF)(H_2O).(DEF)_5$, and $X(TCBB)(DMA)_{4.5}(MeOH)$, where X is one or more non rare earth element (REE) transition metal atoms or REE atoms. In an embodiment, X is one or more elements selected from a group consisting of In, Eu, Ti, V, Cr, Mn, Fe, Co, Ni, Cu, Zn, Ga, Ge, Y, Ru, Ag, Cd, Sn, Sb, Ir, Pb, Bi, that are located in the MOF framework in site isolated locations.

According to an embodiment, a light emitting diode (LED) is disclosed that includes a metal-organic-framework material selected from a group including $X(BTB)_{7/3}$ $(H_2O)_2.(DEF)_6$, $X(BTB)(H_2O).(H_2O)(DEF)$, $X(TTB)_{2/3}$ $(OA).(DMF)_{2.5}$, $X(TTB)(DEF)(H_2O).(DEF)_5$, and $X(TCBB)(DMA)_{4.5}(MeOH)$, where X is one or more non rare earth element (REE) transition metal atoms or REE atoms. In an embodiment, X is one or more elements selected from a group consisting of In, Eu, Ti, V, Cr, Mn, Fe, Co, Ni, Cu, Zn, Ga, Ge, Y, Ru, Ag, Cd, Sn, Sb, Ir, Pb, Bi, that are located in the MOF framework in site isolated locations.

One advantage of the present disclosure is to provide a new photoluminescent material that is a broad white light emitter with warm white light color properties.

Another advantage of the present disclosure is to provide a red light emitter having narrowband emission and high quantum yield.

Another advantage of the present disclosure is to provide a family of materials whose photoluminescent properties can be controlled or tuned by structural variations.

Another advantage of the present disclosure is to provide light emitter that does not thermally quench after heating to commercial device operating temperatures, such as 150° C.

Other features and advantages of the present disclosure will be apparent from the following more detailed description of the preferred embodiment, taken in conjunction with the accompanying drawings which illustrate, by way of example, the principles of the disclosure.

BRIEF DESCRIPTION OF THE DRAWINGS

Wherever possible, the same reference numbers will be used throughout the drawings to represent the same parts.

DETAILED DESCRIPTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete and will fully convey the scope of the invention to those skilled in the art.

The present invention is directed to new photoluminescent metal-organic frameworks (MOFs). The newly developed MOFs include either non rare earth element (REE) transition metal atoms or limited concentrations of REE atoms, including: Ti, V, Cr, Mn, Fe, Co, Ni, Cu, Zn, Ga, Ge, Y, Ru, Ag, Cd, Sn, Sb, Ir, Pb, Bi, that are located in the MOF framework in site isolated locations, and have emission colors ranging from white to red, depending on the metal concentration levels and/or choice of ligand.

According to an embodiment, a group of novel metal-organic-framework materials are disclosed. The group includes $X(BTB)_{7/3}$ $(H_2O)_2.(DEF)_6$, $X(BTB)(H_2O).(H_2O)(DEF)$, $X(TTB)_{2/3}$ $(OA).(DMF)_{2.5}$, $X(TTB)(DEF)(H_2O).(DEF)_5$, and $X(TCBB)(DMA)_{4.5}(MeOH)$, where X is one or more non rare earth element (REE) transition metal atoms or REE atoms. In an embodiment, X is one or more elements selected from a group consisting of In, Eu, Ti, V, Cr, Mn, Fe, Co, Ni, Cu, Zn, Ga, Ge, Y, Ru, Ag, Cd, Sn, Sb, Ir, Pb, Bi, that are located in the MOF framework in site isolated locations.

According to an embodiment, the group includes MOFs synthesized with In, In—Eu, or Eu. According to an embodiment, the group includes $InEu(BTB)_{7/3}(H_2O)_2.(DEF)_6$, $Eu(BTB)(H_2O).(H_2O)(DEF)$, $In(TTB)_{2/3}$ $(OA).(DMF)_{2.5}$, $Eu(TTB)(DEF)(H_2O).(DEF)_5$, and $Eu(TCBB)(DMA)_{4.5}$ (MeOH)

According to an embodiment, a solid state lighting (SSL) device that is disclosed that includes a metal-organic-framework material selected from a group including $X(BTB)_{7/3}$ $(H_2O)_2.(DEF)_6$, $X(BTB)(H_2O).(H_2O)(DEF)$, $X(TTB)_{2/3}$ $(OA).(DMF)_{2.5}$, $X(TTB)(DEF)(H_2O).(DEF)_5$, and $X(TCBB)(DMA)_{4.5}(MeOH)$, where X is one or more non rare earth element (REE) transition metal atoms or REE atoms. In an embodiment, X is one or more elements selected from a group consisting of In, Eu, Ti, V, Cr, Mn, Fe, Co, Ni, Cu, Zn, Ga, Ge, Y, Ru, Ag, Cd, Sn, Sb, Ir, Pb, Bi, that are located in the MOF framework in site isolated locations.

According to another embodiment of the invention, a SSL device is disclosed that includes one or more materials from the group $InEu(BTB)_{7/3}$ $(H_2O)_2.(DEF)_6$, $Eu(BTB)(H_2O).(H_2O)(DEF)$, $In(TTB)_{2/3}$ $(OA).(DMF)_{2.5}$, $Eu(TTB)(DEF)(H_2O).(DEF)_5$, and $Eu(TCBB)(DMA)_{4.5}(MeOH)$.

According to an embodiment, a light emitting diode (LED) is disclosed that includes a metal-organic-framework material selected from a group including $X(BTB)_{7/3}$ $(H_2O)_2.(DEF)_6$, $X(BTB)(H_2O).(H_2O)(DEF)$, $X(TTB)_{2/3}$ $(OA).(DMF)_{2.5}$, $X(TTB)(DEF)(H_2O).(DEF)_5$, and $X(TCBB)(DMA)_{4.5}(MeOH)$, where X is one or more non rare earth element (REE) transition metal atoms or REE atoms. In an embodiment, X is one or more elements selected from a group consisting of In, Eu, Ti, V, Cr, Mn, Fe, Co, Ni, Cu, Zn, Ga, Ge, Y, Ru, Ag, Cd, Sn, Sb, Ir, Pb, Bi, that are located in the MOF framework in site isolated locations.

According to another embodiment of the present invention, an LED is disclosed that includes one or more materials from the group $InEu(BTB)_{7/3}(H_2O)_2.(DEF)_6$, $Eu(BTB)(H_2O).(H_2O)(DEF)$, $In(TTB)_{2/3}$ $(OA).(DMF)_{2.5}$, $Eu(TTB)(DEF)(H_2O).(DEF)_5$, and $Eu(TCBB)(DMA)_{4.5}(MeOH)$.

According to the present disclosure, the MOFs include in their structure: (i) metal ions; and (ii) organic linkers bridging or joining the metal ions. In an embodiment, the metal ion is an ion of one or more non rare earth element (REE) transition metal atoms or REE atoms. In an embodiment, the metal is one or more elements selected from a group consisting of In, Eu, Ti, V, Cr, Mn, Fe, Co, Ni, Cu, Zn, Ga, Ge, Y, Ru, Ag, Cd, Sn, Sb, Ir, Pb, Bi, that are located in the MOF framework in site isolated locations.

In an embodiment, the organic linker is a functionalized heterocyclic aromatic ring. In an embodiment, the functionalized heterocyclic aromatic ring may be a heterocyclic aromatic ring compound that has nitrogen as the functional group or may be a heterocyclic aromatic ring compound that is functionalized by carboxylic acid to add a —COOH group. In an embodiment, the heterocyclic aromatic ring compound is selected from a group including naphtalene, anthtracene, pyridine, pyrimidine, imidazole, benzimidazole, pyrazole, purine, thiophene and benzothiophene derivatives. In an embodiment, the organic linker is selected from a group including (1,3,5-Tris(4-carboxyphenyl)benzene, BTB; 4,4',4"-s-triazine-2,4,6-triyl-tribenzoic acid, TTB; and 1,3,5-Tris(4'-carboxy[1,1'-biphenyl]-4-yl)benzene, TCBB)

The compounds composed of In and In/Eu had broad emission. Complete replacement of In with Eu results in narrowband red emission. The highest QY and lowest thermal quenching are from a red-emitting MOF composed of Eu metal centers and TTB linkers.

It is disclosed herein that $Eu^{3+}$-based metal-organic frameworks (MOFs) can produce the characteristic narrowband red emission of $Eu^{3+}$, with QYs as high as 50% under UV excitation at room temperature, which is among the highest QYs reported for MOFs. Thermal quenching in this material is reversible, maintaining a high QY of 48% at 150° C. This is the highest QY measured at high temperatures (150° C.) reported for this class of materials. As such, these Eu-based MOFs are energy-efficient emitters for inorganic LEDs and OLEDs for SSL that can operate at elevated temperatures.

Metal-organic frameworks (MOFs) are crystalline, periodic systems that are a unique alternative to inorganic phosphors and have been extensively developed for a variety of applications. Luminescence in MOFs arises from both the inorganic and organic components, and the charge transfer interactions between the two. MOFs have many advantages over phosphors as they (i) are inherently more tunable due to their inorganic-organic hybrid structure; (ii) have a homogeneous composition and limited defect sites; (iii) allow the controlled spatial distribution of metal ions into the framework, eliminating agglomeration; (iv) are produced at much lower temperatures; and (v) can be processed as films. High QY, thermal stability, and low thermal quenching are among the criteria that MOFs must satisfy for SSL applications. Thermal quenching is the reduction in QY with increasing temperature and can be reversible or irreversible.

The present disclosure is further directed to specific MOFs for use in SSL applications based on LEDs and OLEDs. Among their unique attributes is their photoluminescence tunability through both the inorganic and organic building blocks, along with the charge transfer interactions between the two. Furthermore, their low processing temperatures, homogeneous compositions, limited defect sites, and controlled spatial distribution of metal ions within the crystalline lattice make them good alternatives to phosphors. Thermal stability and reliable photoluminescent performance at operating temperatures as high as 150° C. are shown, which is needed for MOFs to be used in LED and OLED SSL device applications. The MOFs disclosed herein satisfy these requirements.

The disclosed materials are structurally related, tuned for white and red emissions by choice of metal and/or ligand, and importantly by the charge transfer between the two components.

Material Synthesis Examples

Synthesis of $InEu(BTB)_{7/3}(H_2O)_2(DEF)_6$, (SMOF-2 or Compound 1). The reaction mixture containing $In(NO_3)_3.5H_2O$ (0.043 mmol, 17 mg), $EuCl_3.6H_2O$ (0.043 mmol, 16 mg), 1,3,5-Tris(4-carboxyphenyl)benzene (BTB) (0.043 mmol, 19 mg), oxalic acid (OA) (0.065 mmol, 5.85 mg), N,N'-diethylformamide (DEF) (2.5 mL), and MeOH (2.5 mL) was placed in a 20 mL scintillation vial and was heated to 105° C. for 3 days at a rate of 1.5° C./min and cooled to room temperature at a cooling rate of 1° C./min. Crystalline material with rhombic dodecahedron morphology was obtained.

Synthesis of $Eu(BTB)(H_2O).(H_2O)(DEF)$, (SMOF-6 or Compound 2). The reaction mixture containing $EuCl_3.6H_2O$ (0.043 mmol, 16 mg), 1,3,5-Tris(4-carboxyphenyl)benzene (BTB) (0.021 mmol, 9.5 mg), DEF (2.5 mL), and $H_2O$ (1.5 mL) was placed in a 20 mL scintillation vial and was heated to 115° C. for 1 day at a rate of 1.5° C./min and cooled to room temperature at a cooling rate of 1° C./min. Crystalline material with block-like morphology was obtained.

Synthesis of $In(TTB)_{2/3}(OA).(DMF)_{2.5}$, (SMOF-5 or Compound 3).

The reaction mixture containing $In(NO_3)_3.5H_2O$ (0.021 mmol, 8.5 mg), 4,4',4''-s-triazine-2,4,6-triyl-tribenzoic acid (TTB) (0.021 mmol, 9.5 mg), oxalic acid (OA) (0.065 mmol, 5.85 mg), and N,N'-dimethylformamide (DMF) (2 mL), EtOH (3.25 mL) was placed in a 20 mL scintillation vial and was heated to 115° C. for 3 days at a rate of 1.5° C./min and cooled to room temperature at a cooling rate of 1° C./min. On the basis of the purity of the organic linker, a co-precipitation of a secondary crystalline phase may be noted, under these conditions; for the photoluminescence measurements reported herein, a pure sample of 3 was studied. Crystalline material with polyhedral morphology was obtained.

Synthesis of $Eu(TTB)(DEF)(H_2O).(DEF)_5$, (SMOF-7 or Compound 4). The reaction mixture containing $EuCl_3.6H_2O$ (0.021 mmol, 8 mg), 4,4',4''-s-triazine-2,4,6-triyl-tribenzoic acid, (TTB) (0.043 mmol, 19 mg), N,N'-diethylformamide (DEF) (2 mL), and EtOH (3 mL) was placed in a 20 mL scintillation vial and was heated to 115° C. for 1 day at a rate of 1.5° C./min and cooled to room temperature at a cooling rate of 1° C./min. Plate-like crystalline material was obtained.

Synthesis of $Eu(TCBB)(DMA)_{4.5}(MeOH)$, (SMOF-3 or Compound 5). The reaction mixture containing $EuCl_3.6H_2O$ (0.043 mmol, 16 mg), 1,3,5-Tris(4'-carboxy[1,1'-biphenyl]-4-yl)benzene (TCBB) (0.028 mmol, 19 mg), N,N'-dimethylacetamide (DMA) (1 mL), and MeOH (1 mL) was placed in a 20 mL scintillation vial and was heated to 115° C. for 1 day at a rate of 1.5° C./min and cooled to room temperature at a cooling rate of 1° C./min. Polycrystalline spheres were obtained.

Room Temperature QY Measurements.

Absolute QY measurements were made by exciting the samples with diffuse light within an integrating sphere and simultaneously recording the excitation and emitted light power from the sample at room temperature. Two different sets of samples were studied: (i) the as-synthesized (AS) Compounds 1, 2, 3, 4, and 5 and (ii) the thermally treated (TT) Compounds 2, 4, and 5 only, as they are thermally robust and maintain their structural integrity after the heat treatment; the materials were heated to 150° C. for 10 h, cooled, and tested at room temperature.

Thermal Quenching Measurements.

The thermal quenching studies were performed on TT samples only (Compounds 2, 4, and 5). Thermal quenching experiments were done by inserting a Pyrex NMR tube that contained the sample into an aluminum heater block that was heated to 150° C. on a hot plate. The heated sample was immediately inserted into the integrating sphere. The diffuse excitation and emitted light power were simultaneously recorded as the sample cooled to room temperature. The absolute QYs at 150° C. and room temperature were calculated from these power measurements. Thermal quenching was calculated as $[1-(QY_{150° C}/QY_{RT})] \times 100$.

Gas Sorption Measurements.

Nitrogen adsorption isotherms were measured at 77 K, using a Micromeritics ASAP 2020 surface area and porosity analyzer. Nitrogen of ultrahigh purity 99.999% (Matheson Tri-Gas) was used in these experiments.

Structural Characterization.

An In-based metal-organic framework (SMOF-1) possessing broadband white-light emission was recently discovered (Sava, D. F.; Rohwer, L. E. S.; Rodriguez, M. A.; Nenoff, T. M., J. Am. Chem. Soc. 2012, 134, 3983-3986). Significant improvement of the related color properties in this compound was achieved by 10% in-framework Eu doping. This resulted in a homogeneous metal doping with no change to the crystal structure, improving the correlated color temperature (CCT) values to a warmer white light.

Figure 1:
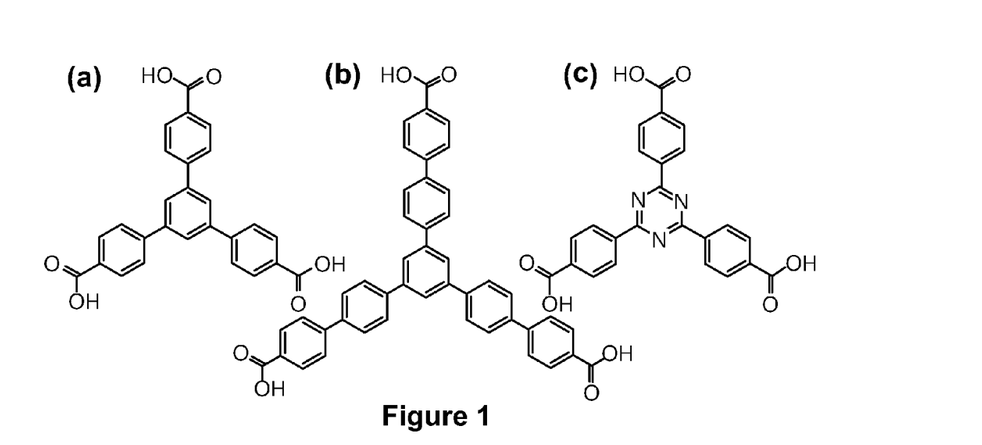
FIG. 1 shows the organic ligands used in forming Compounds 1-5 of this disclosure, and in particular, (a) 1,3,5-Tris(4-carboxyphenyl)benzene (BTB); (b) 1,3,5-Tris(4'-carboxy[1,1'-biphenyl]-4-yl)benzene, (TCBB); and (c) 4,4',4"-s-triazine-2,4,6-triyltribenzoic acid (TTB).

According to the present invention, it has been determined that by tuning of both metal and organic components, efficient charge transfer interactions can be obtained. The present disclosure provides for systematically altering (i) the metal (Eu for In) doping levels and (ii) the electronic structure of the organic linker (electron rich in the benzene-based ligands vs comparably electron deficient in the triazine-based organic linker) to enable ligand-to-metal charge transfer properties, and (iii) the length of the organic spacer, and monitor its effect on the photoluminescence properties. FIG. 1 shows the organic ligands used in forming Compounds 1-5 of this disclosure, and in particular, (a) 1,3,5-Tris(4-carboxyphenyl)benzene (BTB); (b) 1,3,5-Tris(4'-carboxy[1,1'-biphenyl]-4-yl)benzene, (TCBB); and (c) 4,4',4"-s-triazine-2,4,6-triyltribenzoic acid (TTB).

Figure 2:
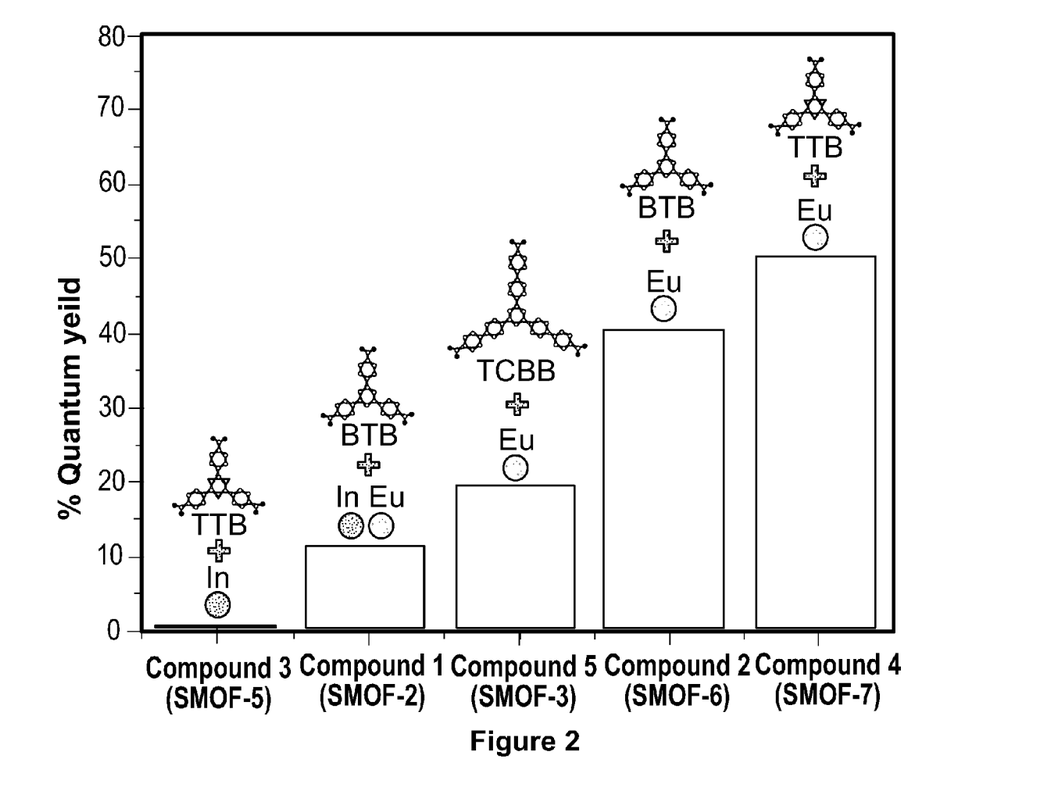
FIG. 2 shows the percent quantum yield in compounds 1, 2, 3, 4 and 5.

FIG. 2 shows the percent quantum yield in Compounds 1, 2, 3, 4 and 5. As can be seen in FIG. 2, these modifications lead to exceptional quantum yields in Compounds 1-5. Compounds 2 and 4 retained their QYs at 150° C. These results represent the highest reported QYs to date for MOF materials at this elevated temperature.

In the first experiment, starting from a similar reaction environment that yielded SMOF-1 (100% In), the reactant metal was increased to an equimolar ratio of Eu to In, enhancing the red component in the reaction. Under these conditions, crystals with rhombic dodecahedron morphology were obtained and determined by single crystal X-ray crystallography studies to be a new phase with the stoichiometry: $InEu(BTB)_{7/3}$ $(H_2O)_2.(DEF)_6$, Compound 1 (SMOF-2). A novel 3-D framework was assembled from two distinct molecular building blocks (MBBs), each containing one of the two metal centers. The 7-coordinate pentagonal bipyramidal geometry of the In metal ion was bridged by a BTB linker in a monodentate way, while two additional organic ligands coordinate via a chelate bidentate fashion. The entire coordination sphere was completed by two additional water molecules. The Eu metal center adopts a dodecahedron 8-coordinate environment, exclusively bridged by BTB ligands binding in a chelate bidentate mode. The overall arrangement resulted in a doubly interpenetrated net. As a result of this feature, the central benzene rings of the BTB organic linker corresponding to each of the individual nets generate $\pi-\pi^*$ stacking interactions at 3.43 Å, similar to the features initially noted in the original SMOF-1 phase.

The structural novelty of Compound 1 is confirmed from a topological perspective as well. The framework is a (3,4)-connected net, not observed in any materials to date. The unique connectivity features are described by the short Schläfli (point) symbol for the net {6-82}6 {6284}3 {62-8}3 {83}. There are five topologically distinct vertices: two are associated with the two metal centers; as such, In acts as a 3-connected node and Eu as a 4-connected node. The remaining three nodes are associated with independent BTB linkers, simplified as 3-connected nodes, with the extension point chosen in the center of the BTB ligand.

In the second alteration phase in this MOF family, 100% Eu was used by reacting $EuCl_3.6H_2O$ with BTB in a $DEF/H_2O$ isostructural with a family of 3-D porous lanthanide BTB-based frameworks, the compound was isolated under slightly different experimental conditions by using a different metal source and different solvent system. The honeycomb-like framework was assembled from infinite Eu chains. Thus, individual Eu centers adopt a 9-coordinate tricapped trigonal prismatic geometry capped by 6 BTB linkers: four bridge in a chelate-bidentate mode and two in a bidentate fashion (shared with the nearest metal center). One water molecule completes the coordination sphere of each Eu metal center. The material undergoes a subtle structural transformation when the coordinated water is removed.

Under the reported composition, the material is dehydrated at ~110° C.; the additional weight loss in the 110° C.-240° C. range is associated with the removal of DEF molecules. As such, when the solvent water molecule is removed, the Eu chain rearranges. The result is that each individual metal center maintains its 9-coordinate tricapped trigonal prismatic geometry; however, all linkers are now coordinating to the metal in a chelate-bidentate fashion. This only slightly alters the unit cell parameters, while the overall structural features are maintained. The distance between the Eu metal centers is 4.115 Å in the as-synthesized material, while in the dried form this contracts to 3.793 Å. Additionally, this change also significantly influences the distance between the centroids of adjacent central benzene rings, from 4.151 Å in the parent material to 3.793 Å in the dried form.

In Compound 3, enhancement of the electronic structure of the BTB ligand was considered. A triazine derivative, 4,4',4"-s-triazine-2,4,6-triyl-tribenzoic acid (TTB), was chosen to substitute the center benzene core in BTB in an attempt to enhance the electron affinity of the complexes. Triazine derivatives are electron-deficient heterocycles, commonly employed as active materials in OLEDs. In an attempt to synthesize an SMOF-1 analogue and evaluate the effects of this substitution, $In(NO_3)_3.5H_2O$ was reacted with TTB and oxalic acid in a mixed DMF/EtOH solvent system. As expected, an isostructural 3-D framework was crystallized, characterized, and formulated by single crystal X-ray crystallography studies as $In(TTB)_{2/3}$ $(OA).(DMF)_{2.5}$, Compound 3 (SMOF-5).

Interestingly, although the previously reported SMOF-1 and Compound 3 are isostructural both structurally and topologically, they crystallize in different crystal systems: cubic (SMOF-1) and orthorhombic for Compound 3. The unit cell axis contracted along the a direction from 33.975 to 32.092 Å, while it expanded along both b and c directions to 34.184 Å. This resulted in an overall decrease in the unit cell volume from 39,217 Å3 to 37,501 Å3. Similar to SMOF-1, sequential $\pi-\pi^*$ interactions in the 3.31-3.57 Å range are noted between the aromatic rings of the TTB linkers of both frameworks. This is as a result of the combined unique combination of framework corrugation-interpenetration in Compound 3.

The fourth member of this MOF family was obtained from the reaction of $EuCl_3.6H_2O$ and TTB, carried out in a in a mixed solvent system of DEF/EtOH, which yields crystalline material with plate-like morphology. The compound was characterized by single crystal X-ray crystallography studies and formulated as $Eu(TTB)(DEF)(H_2O).(DEF)_5$, Compound 4 (SMOF-7). In this case, a unique 3-D network was accessed, with distinct structural features as compared to Compound 2. The framework is assembled from a Eu dimetal cluster, bridged by 6 TTB ligands: two bind in a chelate-bidentate mode, another two in a bridging bidentate fashion, while the remaining two adopt a bridging chelate-bidentate mode. Within this cluster, each Eu metal center has a 9-coordinate tricapped trigonal prismatic geometry: eight of the available sites are coordinated by 4 independent TTB organic ligands, while the remaining coordination sphere is completed by one water and one DEF molecule per Eu metal center. The distance between the two Eu metal centers is 4.185 Å, comparable to the 4.115 Å observed in the hydrated, as-synthesized version in Compound 2.

From a topological perspective, Compound 4 is a heterocoordinated (3,6)-net, not observed in any materials to date. The dimetal cluster is represented as an octahedral node, whereas the TTB linker is simplified as a 3-connected node. The short Schläfli (point) symbol for the net is $\{4 \cdot 8^2\}2\{4^2 \cdot 8^{12} \cdot 10\}$.

Lastly, Compound 5 (SMOF-3) was obtained by reacting of $EuCl_3.6H_2O$ and TCBB in a mixed solvent system of DMA/MeOH. The material crystallizes as very small rectangular blocks, agglomerated in well-defined polycrystalline spheres. A structure solution from X-ray single-crystal diffraction studies was not feasible in this case due to the polycrystalline nature of this material. Alternative ways to solve the crystal structure are currently being explored. Significant insights into the properties of Compound 5 were provided by the PXRD and TGA analyses. The PXRD pattern shows several peaks in the signature low 2-theta region, indicative of a large unit cell parameter. Additionally, the TGA analysis reveals gradual weight loss equivalent to ~30% of the total mass, in the 35 to 200° C. temperature range. This behavior is often encountered in porous materials and here is associated with the loss of DMA and MeOH solvent molecules residing in the porous lattice.

In order to investigate the potential porosity of the new phase, Compound 5 was soaked in EtOH for 1 day. Nitrogen gas sorption experiments were carried out on the EtOH exchanged sample upon degassing at room temperature for 18 h. The studies confirmed permanent microporosity and a high BET specific surface area of 1011 m$^2$ g$^{-1}$ in this EuTCBB compound. As expected, this is considerably higher than the surface area previously reported for the Eu-BTB framework (Compound 2), 700 mg 1.

In order to aid the structure-property relationship of this phase, we investigated the gas sorption capabilities of Compound 5. New materials are needed and being explored to reliably capture and store volatile fission gases, such as 12.16 Compound 5 revealed a high uptake of ~115 wt % I$_2$, qualifying among the highest reported for porous materials, in particular MOFs. The capacity for I$_2$ molecular adsorption confirms a framework structure with accessible porosity.

Photoluminescence Properties.

Photoluminescence excitation (PLE) and emission (PL) spectra were collected on Compounds 1-5 (Table 1).

TABLE 1

Photoluminescence Excitation (PLE) and Emission (PL)
Monitored at Various Wavelengths in Compounds 1-5

| material | formula | Excitation wavelength (nm) | Emission wavelength (nm) |
|---|---|---|---|
| Compd 1 (SMOF-2) | InEu(BTB)$_{7/3}$ (H2O)$_2$ · (DEF)$_6$ | 614 | 330-390 |
| Compd 2 (SMOF-6) | Eu(BTB)(H$_2$O) · (H$_2$O)$_x$(DEF)$_y$ | 614 | 330 |
| Compd 3 (SMOF-5) | In(TTB)$_{2/3}$(OA) · (DMF)$_{2.5}$ | 500 and 614 | 330-390 |
| Compd 4 (SMOF-7) | Eu(TTB)(DEF) (H$_2$O) · (DEF)5 | 614 | 330 and 394 |
| Compd 5 (SMOF-3) | Eu(TCBB) (DMA)4.5(MeOH) | 614 | 394 |

Figure 3:
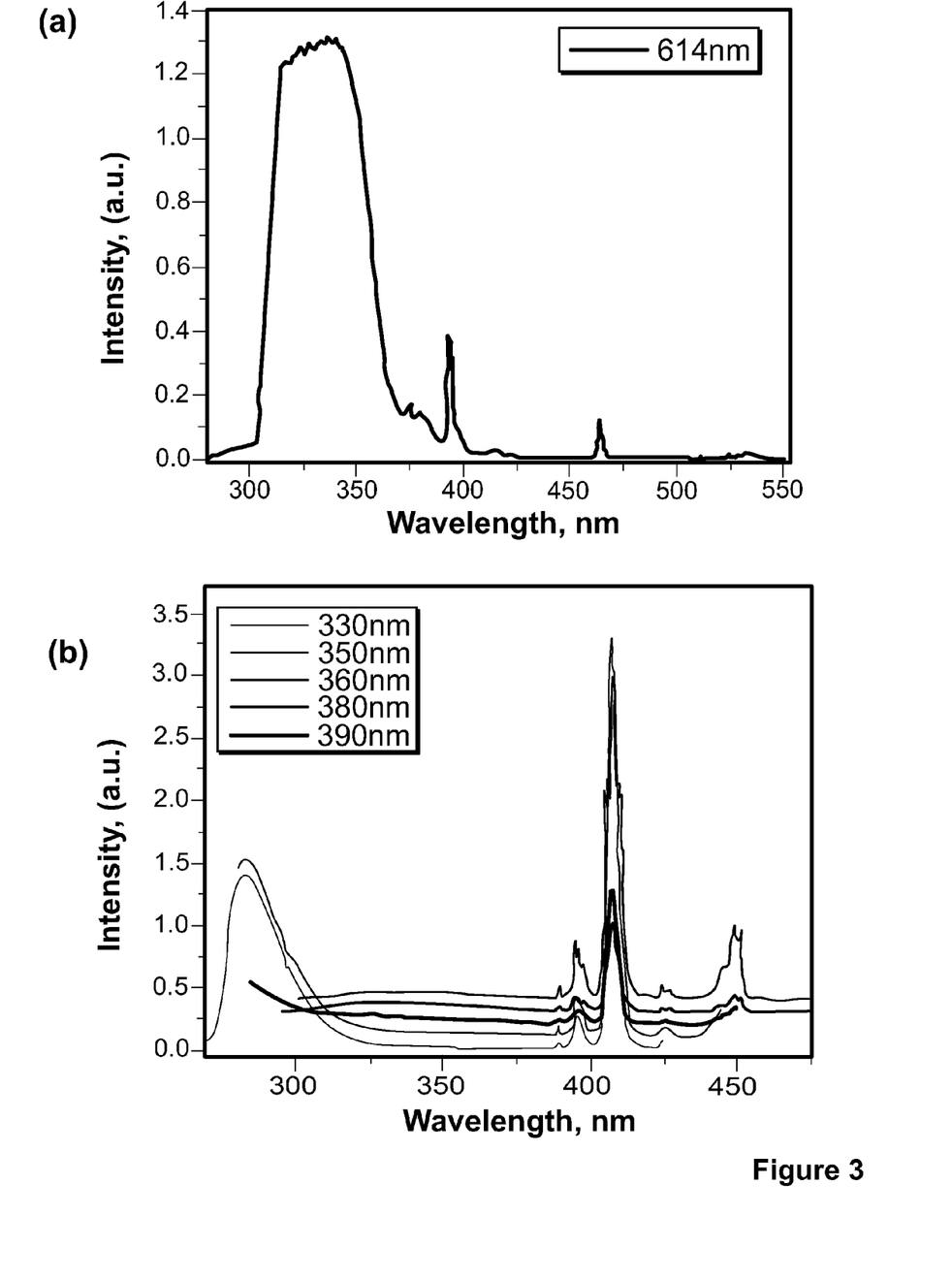
FIG. 3(a) shows PLE, monitored at an emission wavelength of 614 nm, for Compound 1.
FIG. 3(b) shows the PL emission spectra for compound 1 excited between 330 nm and 390 nm.

FIG. 3a shows the excitation spectra of Compound 1 monitored at 614 nm and FIG. 3b the measured emission when the sample was excited between 330 and 390 nm (the spectra of these two figures are offset for clarity). The emission peak at 390 nm, upon excitation at 330 and 350 nm, corresponds to the emission from the organic linker. The additional narrowband emission peaks between 590 and 695 nm are assigned to the Eu$^{3+}$ parity forbidden 5D-7F transitions at ~590 nm (magnetic dipole transition 5D0-7F1) and electric dipole transitions at ~616 nm (5D0-7F2), 650 nm (5D0-7F3), and 695 nm (5D0-7F4).

While this is an In—Eu compound, the white component is overpowered by the dominant intrinsic red emission of the Eu$^{3+}$ metal center, and the broadband emission is too weak to be observed. The absolute QY in 1 measured at room temperature under 380 nm excitation is 11%, significantly improved as compared to the 4% reported previously in SMOF-1 (0-10% Eu doping).

Figure 4:
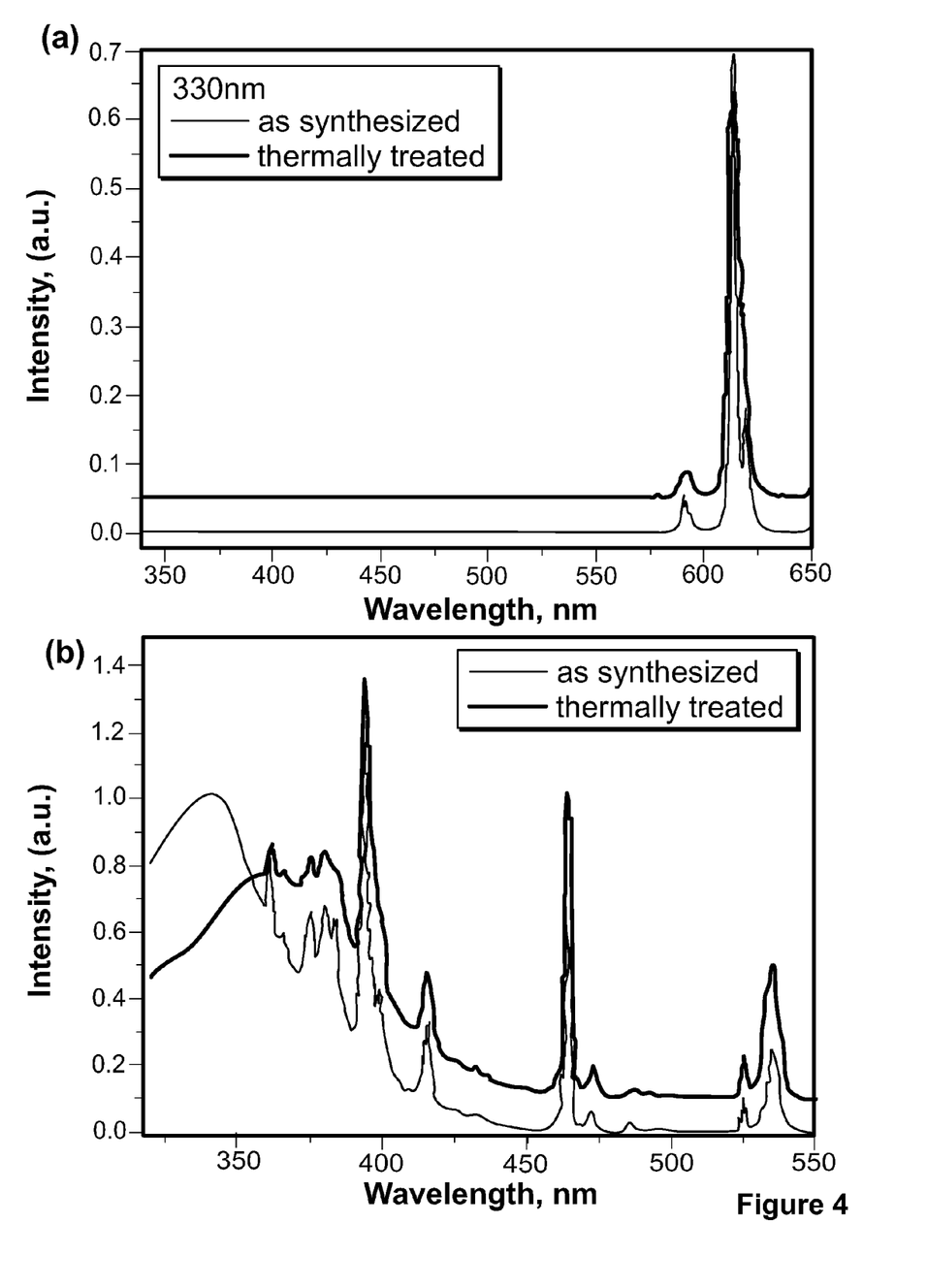
FIG. 4(a) shows PLE spectra for the as-synthesized and thermally treated at 150° C. Compound 2 monitored at an emission wavelength of 614 nm.
FIG. 4(b) shows the PL emission spectra for the as-synthesized and thermally treated at 150° C. Compound 2 excited at 330 nm.
Figure 5:
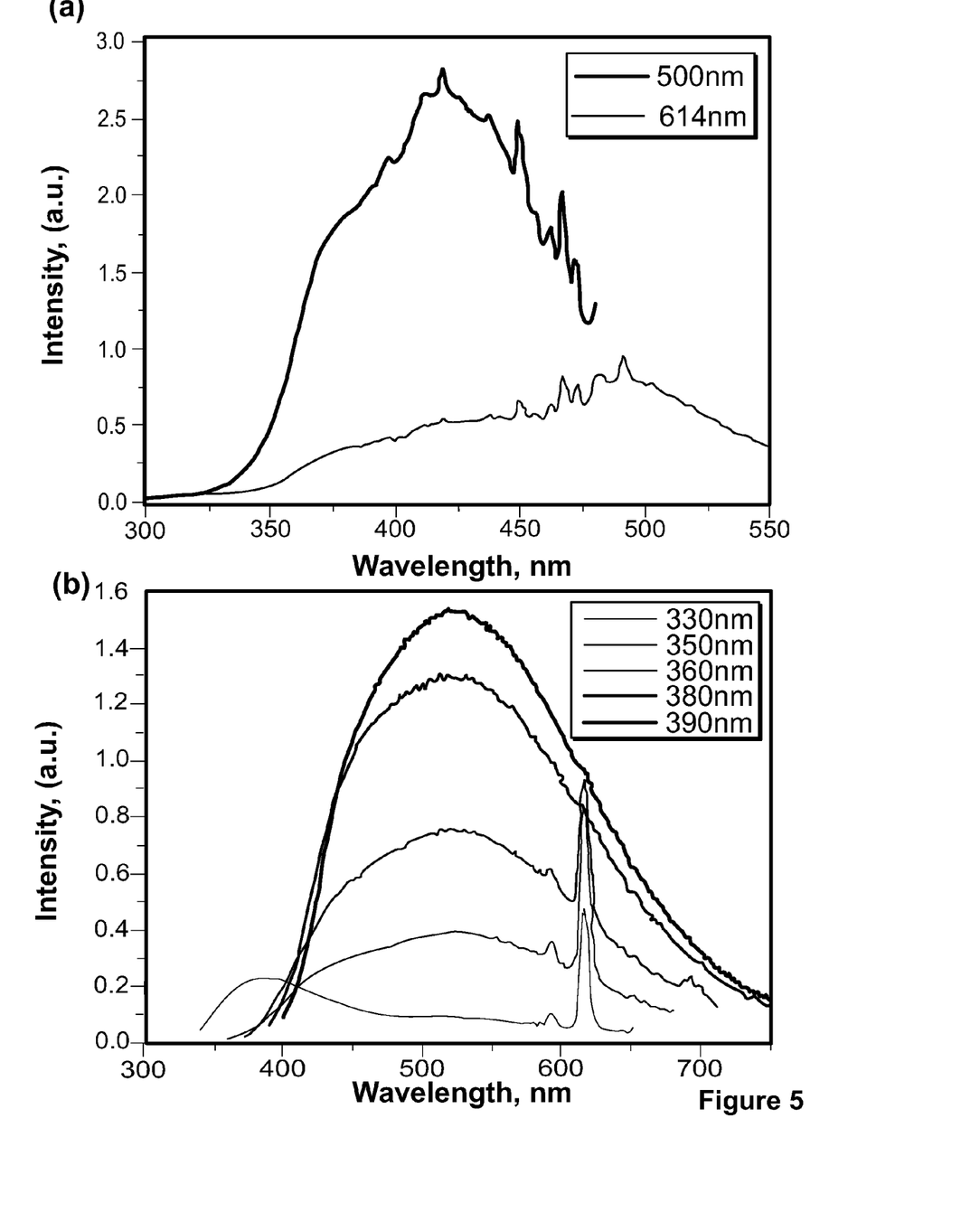
FIG. 5(a) shows PLE spectra for Compound 3, emission monitored at 500 and 614 nm.
FIG. 5(b) shows PL emission spectra for Compound 3 excited at 330-390 nm.

Compound 2 is a red-emitter, consistent with the framework being constructed entirely from Eu$^{3+}$ metal centers. FIG. 4a shows the excitation spectrum monitored at 614 nm. The emission spectrum measured for the sample excited at 330 nm (FIG. 4b) reveals the characteristic Eu$^{3+}$ emission peaks. FIGS. 4(a) and 4(b) emission spectra offset for clarity. The absolute QY measurements at room temperature for the AS and TT samples of Compound 2 are shown in Table 2.

TABLE 2

Room Temperature QY Measurements on
As-Synthesized (AS) and Thermally Treated (TT)
Samples at 150° C. for 10 h in Compounds 2, 4, and 5

| excitation wavelength (nm) | % Qy Compd 2 | | % Qy Compd 4 | | % Qy Compd 5 | |
|---|---|---|---|---|---|---|
| | AS | TT | AS | TT | AS | TT |
| 340 | 18 | 14 | 46 | 50 | | |
| 350 | | | | | 14 | 15 |
| 394 | 27 | 40 | 22 | 19 | 19 | 19 |

A remarkable increase in the QY from 27% for the AS sample to 40% for the TT Compound 2 is noted for the sample excited at 394 nm. This is directly correlated to the structural differences observed in the dried heat treated form as compared to the form of Compound 2. The local structure surroundings of the Eu metal center decreases in symmetry with the removal of the coordinated water molecule. The space group changes from R32 in the form to P3 for the dried form, resulting in the QY increase. The expected induced structural transformation in Compound 2, as well as the thermal stability upon heat treatment at 150° C. for 10 h, was confirmed by the PXRD patterns. This suggests that the PL properties in 2 are not guest-based/induced but that they are strictly related to the structural features in this material. Since an increase in the QY was noted for the TT sample at 394 nm, possible thermal quenching effects were evaluated in Compound 2 by measuring the QY directly at 150° C. The sample has good stability, maintaining a high QY of 35% under these conditions (~12% thermal quenching).

The color properties of Compound 3 were investigated and compared with those observed in SMOF-1, the BTB analogue of Compound 3. As anticipated, Compound 3 also emits white light, due to similarity in the structure-function of the two related compounds. FIG. 3(a) shows the excitation spectra of Compound 3 monitored at 500 nm and 614 nm. FIG. 3(b) shows the emission spectra excited between 330 nm and 390 nm, which reveals a similar broadband emission, previously observed in SMOF-1. In addition, two narrow emission bands are noted at 592 nm and 615 nm. The presence of these bands leads to improved color properties, as previously noted in the 10% Eu-doped SMOF-1.

Table 3 shows color properties of Compound 3. As can be seen from Table 3, Compound 3 reveals outstanding CRI and CCT color parameters and chromaticity coordinates, consistent over the excitation wavelength range between 350 and 390 nm; the QY is negligible.

TABLE 3

Color properties in Compound 3

| excitation wavelength (nm) | CRI | CCT (K) | x | y |
|---|---|---|---|---|
| 330 | 74 | 6236 | 0.32 | 0.28 |
| 350 | 96 | 5422 | 0.33 | 0.36 |
| 360 | 88 | 6100 | 0.31 | 0.36 |
| 380 | 82 | 6415 | 0.30 | 0.36 |
| 390 | 81 | 6140 | 0.31 | 0.38 |

The temperature dependence on the PL properties was determined for the as-synthesized and TT Compound 4. The structural integrity in Compound 4 is preserved after the thermal treatment at 150° C. for 10 h, as evidenced by PXRD data. Similar excitation (FIG. 6(a)) and emission profiles (FIGS. 6(b) and 6(c)) are noted for Compound 4, independent of the thermal treatment. As expected, this Eu-TTB compound emits red light; the characteristic $Eu^{3+}$ emission peaks are observed in FIGS. 6(b) and 6(c).

Figure 6:
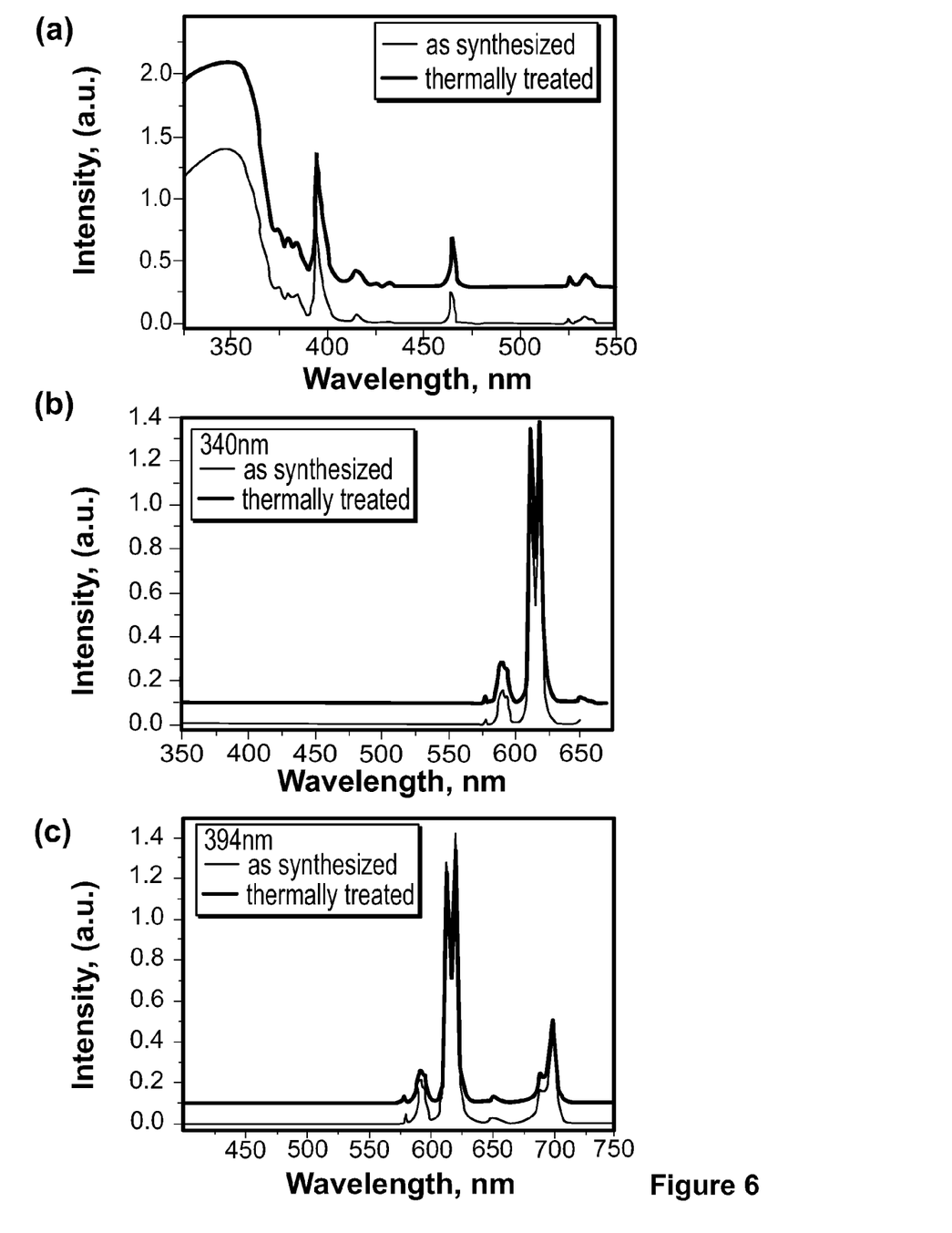
FIG. 6(a) shows PLE spectra for the as-synthesized and thermally treated Compound 4 monitored at an emission wavelength of 614 nm.
FIG. 6(b) shows PL spectra for the as-synthesized and thermally treated Compound 4 excited at 340 nm.
FIG. 6(c) shows PL spectra for the as-synthesized and thermally treated Compound 4 excited at 394 nm.

As can be seen in Table 2, Compound 4 has a very high QY. The highest QY measured at room temperature and 340 nm excitation was 50% for the TT sample. This performance may be correlated with improved ligand-to-metal energy transfer. Importantly, QY measurements performed at 150° C. reveal that the sample maintains a very high QY of ~48% (only 5% thermal quenching). This finding is unprecedented for MOF materials and is comparable to measured thermal quenching results for commercial YAG:Ce phosphors and Eu3+-doped tantalates.

Figure 7:
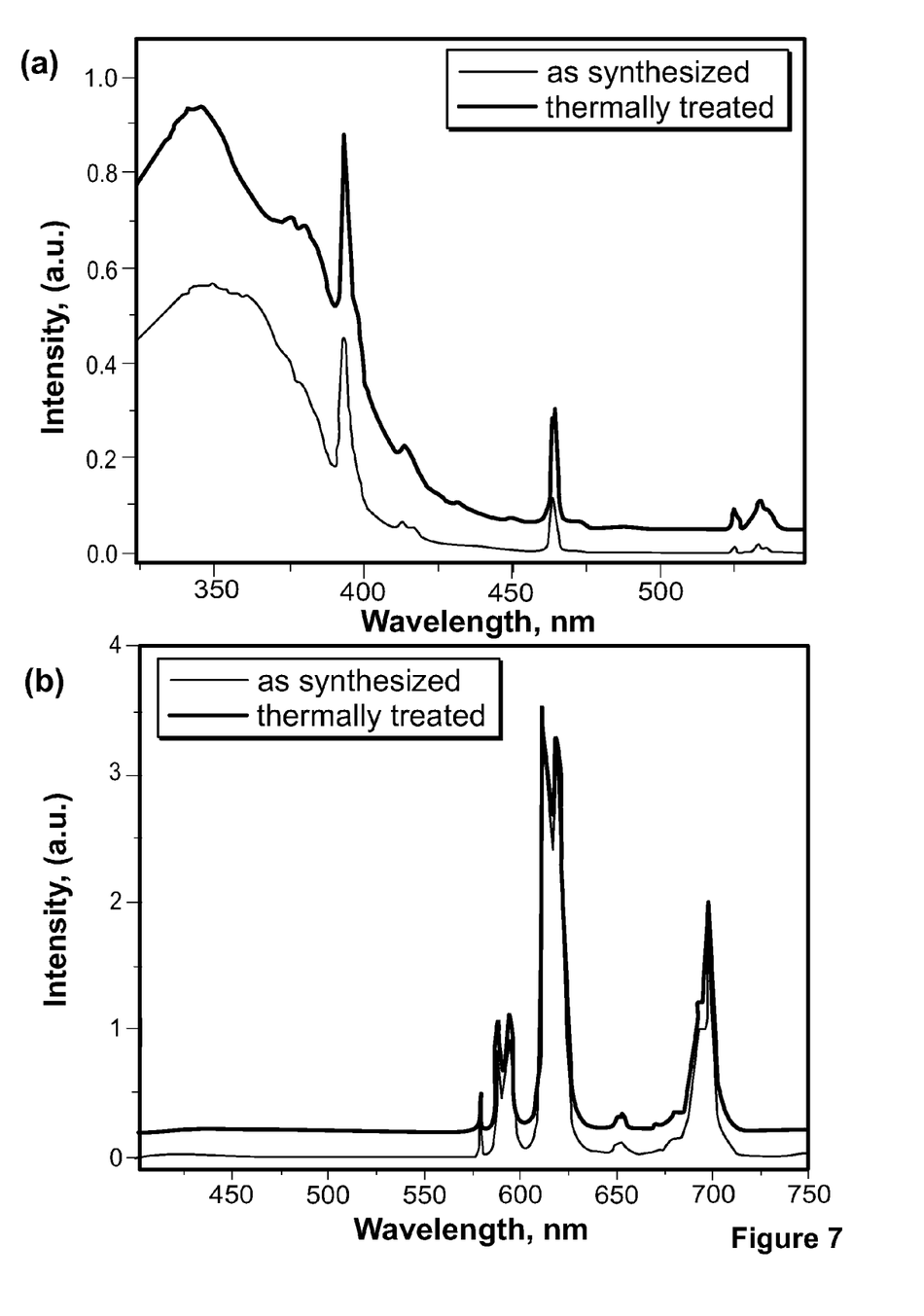
FIG. 7(a) shows PLE spectra for the as-synthesized and thermally treated Compound 5 monitored at an emission wavelength of 614 nm.
FIG. 7(b) shows PL spectra for the as-synthesized and thermally treated Compound 5 excited at 394 nm.

Lastly, the PL properties of Compound 5 were evaluated. As anticipated, this material is a red-emitter, as it consisted entirely of Eu metal centers. The photoluminescence emission and excitation spectra monitored at room temperature for the AS and TT sample to 150° C. are shown in FIGS. 7(a) and 7(b). A quantum yield of 19% measured at room temperature under 394 nm excitation is maintained for both AS and TT Compound 5 (see Table 2). There is ~89% thermal quenching in this sample and is reversible. The thermally induced quenching mechanism might be related to the coordination environment of the metal, though the structure of the heat treated sample still needs to be determined.

Summary

The MOFs disclosed herein offer significant insights into the relationship between the photoluminescent properties and the distinct structural features unique to each compound. The frameworks constructed from single-metal-ion based molecular building blocks have good absolute quantum yields but decreased thermal stability Compounds 1 (In—Eu) and Compound 3 (In). In addition, these materials are also structurally related, as they all consist of 2-fold interpenetrated nets. Alternatively, the infinite Eu-based chain molecular building blocks noted in Compound 2 and the Eu dimetal cluster in Compound 4 are thermally robust and enable high quantum yields and low thermal quenching at temperatures as high as 150° C.

The metal coordination has a significant effect on the structure of each unique MOF and its PL properties. In Compound 1, the Eu coordination sphere is fully satisfied by the bridging chelate bidentate BTB linkers, whereas the In atoms accommodate two water molecules in addition to the BTB bridging carboxylate. Upon their removal, the integrity of the structure is disrupted and the QY decreases. Significant enhancement in the QY is measured for the thermally treated Compound 2, excited at 394 nm (exciting the $Eu^{3+}$). This is directly correlated with the removal of the coordinated water molecules, known to quench the Eu emission, accompanied by the decrease in the symmetry. In Compound 4, a similar QY is noted for both the as-synthesized (one water and one DEF molecule/per metal) and thermally treated samples from 100° C. and 150° C. (temperatures at which both coordinated solvent molecules are removed).

A direct comparison of the compounds entirely based on Eu (Compounds 2, 4, and 5) reveals that the highest QY in Compounds 2 and 5 was measured for the samples excited at 394 nm, corresponding to the excitation of the $Eu^{3+}$ metal. In contrast, the enhanced QY in Compound 4 was obtained under 340 nm excitation, which excites the ligand-to-metal charge transfer band. The lone pairs on the nitrogen atoms in the triazine rings in the TBT linker present in Compound 4 are easily delocalized, which should assist with the efficient charge transfer. These findings suggest slightly different luminescence mechanisms for the efficient emission in these three compounds.

Finally, to complement these observations, the general trend observed here implies that the quantum yield is directly correlated with the rigidity and the thermal robustness of the structure (as correlated between PL and TGA testings). An additional explanation for enhanced quantum yields at high temperatures might also be associated with improved ligand-to-metal charge transfer, once all of the solvent molecules are removed.

According to an embodiment, the disclosed MOFs may be used in SSL applications, for example, but not limited to SSL based on LEDs and/or OLEDs. Among their unique attributes is their photoluminescence tunability through both the inorganic and organic building blocks, along with the charge transfer interactions between the two. Furthermore, their low processing temperatures, homogeneous compositions, limited defect sites, and controlled spatial distribution of metal ions within the crystalline lattice make them promising alternatives to phosphors. The disclosed MOFs have thermal stability and reliable photoluminescent performance at operating temperatures as high as 150° C., which make them suitable for SSL device applications.

The reported materials are structurally related, tuned for white and red emissions by choice of metal and/or ligand, and importantly by the charge transfer between the two components. Eu-based Compounds 2 and 4 have the highest quantum yields (40 and 50%, respectively) after thermal treatment at 150° C. Compound 2 has 12% reduction in QY due to thermal quenching at 150° C., while Compound 4 exhibits a decrease in QY of only 5%. These findings represent the highest quantum yields reported for MOFs at high temperatures. It was found that the coordination environment of the metal center plays a significant role in the emission quenching, in conjunction with the electronic configuration of the organic linker.

Eu-based compounds $Eu(BTB)(H_2O).(H_2O)_x(DEF)_y$, which is referred to as SMOF-6 or Compound 2, and $Eu(TTB)(DEF)(H_2O).(DEF)_5$, which is referred to as SMOF-7 or Compound 4, have the highest quantum yields (40 and 50%, respectively) after thermal treatment at 150° C. SMOF-6 has 12% reduction in QY due to thermal quenching at 150° C., while 4 exhibits a decrease in QY of only 5%. These findings represent the highest quantum yields reported for MOFs at high temperatures. It was found that the coordination environment of the metal center plays a significant role in the emission quenching, in conjunction with the electronic configuration of the organic linker.

The invention being thus described, it will be obvious that the same may be varied in many ways. Such variations are not to be regarded as a departure from the spirit and scope of the invention, and all such modifications as would be obvious to one skilled in the art are intended to be included within the scope of the appended claims. It is intended that the scope of the invention be defined by the claims appended hereto. The entire disclosures of all references, applications, patents and publications cited above are hereby incorporated by reference.

In addition, many modifications may be made to adapt a particular situation or material to the teachings of the disclosure without departing from the essential scope thereof. Therefore, it is intended that the disclosure not be limited to the particular embodiment disclosed as the best mode contemplated for carrying out this disclosure, but that the disclosure will include all embodiments falling within the scope of the appended claims.

What is claimed is:

1. A metal-organic-framework material having the formula selected from a group consisting of $X(BTB)_{7/3}(H_2O)_2.(DEF)_6$, $X(BTB)(H_2O).(H_2O)(DEF)$, $X(TTB)_{2/3}(OA).(DMF)_{2.5}$, $X(TTB)(DEF)(H_2O).(DEF)_5$, and $X(TCBB)(DMA)_{4.5}(MeOH)$, where X is one or more non-rare earth element transition metal atoms or rare earth element atoms.

2. The material of claim 1, wherein the metal atom is an ion of one or more elements selected from a group consisting of In, Eu, Ti, V, Cr, Mn, Fe, Co, Ni, Cu, Zn, Ga, Ge, Y, Ru, Ag, Cd, Sn, Sb, Ir, Pb and Bi.

3. The material of claim 1, wherein the metal-organic-framework material selected from a group consisting essentially of $InEu(BTB)_{7/3}(H_2O)_2.(DEF)_6$, $Eu(BTB)(H_2O).(H_2O)(DEF)$, $In(TTB)_{2/3}(OA).(DMF)_{2.5}$, $Eu(TTB)(DEF)(H_2O).(DEF)_5$, and $Eu(TCBB)(DMA)_{4.5}(MeOH)$.

4. A solid state lighting device comprising one or more materials of claim 1.

5. A light emitting diode comprising one or more of the materials of claim 1.

* * * * *